(12) United States Patent
Van Buggenhout et al.

(10) Patent No.: US 10,217,874 B2
(45) Date of Patent: Feb. 26, 2019

(54) SEMICONDUCTOR DEVICE HAVING A TRANSPARENT WINDOW FOR PASSING RADIATION

(71) Applicant: MELEXIS TECHNOLOGIES NV, Tessenderlo (BE)

(72) Inventors: Carl Van Buggenhout, Aalst (BE); Jian Chen, Heist-op-den-Berg (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 0 days.

(21) Appl. No.: 15/463,180

(22) Filed: Mar. 20, 2017

(65) Prior Publication Data

US 2017/0194512 A1 Jul. 6, 2017

Related U.S. Application Data

(63) Continuation of application No. 14/639,334, filed on Mar. 5, 2015, now Pat. No. 9,620,656.

(30) Foreign Application Priority Data

Mar. 7, 2014 (GB) .................................. 1404108.1

(51) Int. Cl.
*H01L 21/00* (2006.01)
*H01L 31/0203* (2014.01)
(Continued)

(52) U.S. Cl.
CPC .... *H01L 31/0203* (2013.01); *H01L 27/14618* (2013.01); *H01L 27/14623* (2013.01);
(Continued)

(58) Field of Classification Search
None
See application file for complete search history.

(56) References Cited

U.S. PATENT DOCUMENTS 6,229,190 B1 5/2001 Bryzek et al.
6,643,919 B1 * 11/2003 Huang ................ B29C 33/0044
257/E23.066
(Continued)

FOREIGN PATENT DOCUMENTS

EP  0 813 236 A1  12/1997
EP  1 393 367 A2   3/2004
(Continued)

OTHER PUBLICATIONS

Great Britain Search Report from corresponding Great Britain Application No. 1404108.1, dated Jul. 16, 2014.
(Continued)

*Primary Examiner* — Hung Vu
(74) *Attorney, Agent, or Firm* — Workman Nydegger

(57) ABSTRACT

Method of encapsulating a semiconductor structure comprising providing a semiconductor structure comprising an opto-electric element located in a cavity formed between a substrate and a cap layer, the cap layer being made of a material transparent to light, and having a flat upper surface; forming at least one protrusion on the cap layer; bringing the at least one protrusion of the cap layer in contact with a tool having a flat surface region, and applying a opaque material to the semiconductor structure where it is not in contact with the tool; and removing the tool thereby providing an encapsulated optical semiconductor device having a transparent window integrally formed with the cap layer.

7 Claims, 5 Drawing Sheets

(51) Int. Cl.
*H01L 31/0216* (2014.01)
*H01L 27/146* (2006.01)

(52) U.S. Cl.
CPC .. *H01L 27/14649* (2013.01); *H01L 27/14685* (2013.01); *H01L 31/02164* (2013.01)

(56) References Cited

U.S. PATENT DOCUMENTS

| | | |
|---|---|---|
| 2002/0168795 A1 | 11/2002 | Schuurmans |
| 2006/0208326 A1 | 9/2006 | Nasiri et al. |
| 2009/0057799 A1* | 3/2009 | Chan ................... H01L 31/0203 257/433 |
| 2012/0230669 A1 | 9/2012 | Abe |

FOREIGN PATENT DOCUMENTS

| | | |
|---|---|---|
| EP | 1 430 522 A1 | 6/2004 |
| EP | 2 384 426 A1 | 11/2011 |
| EP | 2 889 909 A2 | 7/2015 |
| WO | 02/093642 A2 | 11/2002 |

OTHER PUBLICATIONS

Extended European Search Report from corresponding European Application No. 15157383.9, dated Jul. 9, 2015.

* cited by examiner

SEMICONDUCTOR DEVICE HAVING A TRANSPARENT WINDOW FOR PASSING RADIATION

FIELD OF THE INVENTION

The present invention relates to the field of methods of manufacturing semiconductor devices and to semiconductor devices thus obtained, more in particular to methods of packaging semiconductor devices such as e.g. IR-sensors, in a package having a transparent window for passing radiation, e.g. IR-light, and to devices obtained by such methods.

BACKGROUND OF THE INVENTION

Several packages and packaging techniques for encapsulating integrated circuits are known in the art, such as glass, metal, ceramic and plastic packages.

As electronic products increase in functionality and complexity, there is an emphasis on affordability, miniaturization, and energy efficiency of the semiconductor devices as a whole. The telecommunications, automotive, and commercial electronic markets are the leading drivers for these trends. These markets see high volume manufacturing with millions of units on a yearly basis. The choice of the packaging material for the electrical components for these markets can have a substantial impact on the cost of the final product. Therefore plastic encapsulate components are almost universally used in non-military applications over the conventional ceramic or metal electronic packages. Metal and ceramic packages are mostly used when hermetic packages are required, such as in military applications.

Plastic packaging may use organic materials for environmental protection. In contrast to hermetically sealed packages, organic material usually contacts the active element (or a thin inorganic barrier layer) in the plastic package.

Post molded and pre-molded plastic packaging is the dominant technology in packaging today. Post molded plastic packages are formed after chips are attached to the mounting surface, such as a metal lead frame, and are electrically connected. Typically, a thermosetting epoxy resin is used to form the package body around the chip and mounting surface. There are many types of post molded packages due to the popularity and versatility of polymers. However, this process does subject the die and wire bonds of the package to the harsh molding environment.

Pre-molded packaging provides a less harsh environment for packaging sensitive chips requiring a low cost assembly. The main element is that the chip and interconnects are decoupled from the molding process. The package is made by either a transfer molded process using a thermosetting epoxy resin or an injection molding process. The chip and interconnects are then encapsulated to protect them from the environment. In some cases, a plastic lid is used to seal the plastic package. The ejection molding process easily produces cavity style packages that are increasingly useful for newer optical and electromechanical chips (MEMS). The injection molding process allows for precise cavity packages to be manufactured automatically.

EP0813236(A1) describes a method of encapsulating an integrated semi-conductor circuit, by bringing a column into contact with the integrated circuit before applying a molding compound, so as to form a cavity on top of the integrated circuit when the column is removed. A tube was also used before applying the molding compound so as to create an edge for fixing a window component can be fitted to close the cavity.

US2002/0168795(A1) describes a method for encapsulating a pressure sensor into a package, whereby a mold comprising a pin is used to create an opening in the package. After removal of the pin, an airway is created to the pressure sensor.

FIG. 1(a) to FIG. 1(c) are schematic representations of a process that can be used for encapsulating an integrated circuit that is sandwiched between a substrate (bottom) and a transparent cap layer (top). The mold has a protrusion which is brought into contact with the cap layer for defining an opening to be made in the package for allowing passage of radiation, e.g. light.

SUMMARY OF THE INVENTION

It is an object of embodiments of the present invention to provide a method for packaging, in an efficient, easily yet reliable way, semiconductor devices such that the package has a transparent window for passing radiation.

This objective is accomplished by a method according to embodiments of the present invention.

It is also an object of embodiments of the present invention to provide a packaged optical semiconductor device with a transparent window.

This objective is accomplished by a packaged optical semiconductor device according to embodiments of the present invention.

In a first aspect, the present invention provides a method of manufacturing a packaged semiconductor device with a transparent window, comprising the steps of: a) providing a semiconductor structure comprising an opto-electric element located in a cavity formed between a substrate and a cap layer, the cap layer being made of a material transparent to light, and having a substantially flat, e.g. flat upper surface; b) forming at least one protrusion extending on top of the cap layer; c) bringing the at least one protrusion of the cap layer in contact with a tool having a substantially flat, e.g. flat surface region, and applying an opaque material to the semiconductor structure where the latter is not in contact with the tool; d) removing the tool thereby providing a packaged optical semiconductor device having a transparent window.

It is an advantage of this method that it allows a tool with a substantially flat, e.g. flat surface region to be used, instead of a tool having a protrusion for making a cavity. This avoids that a different tool needs to be made for each different semiconductor device, but allows the tool to be reused over multiple designs, thereby considerably saving on tool costs.

It is an advantage of this method, that it allows for more complicated shapes to be made, because no tool needs to be extracted from the package after the molding material is applied.

It is an advantage of this method that a tool with a substantially flat, e.g. flat surface area can be used, e.g. because such a tool is much easier to make and/or clean than a tool with a protrusion as used in the prior art.

It is an advantage of this method that it allows windows of many different geometries to be made, e.g. with a predefined field-of-view, e.g. with a square, rectangular, circular, or an irregular shape.

The solution of the present invention is based on forming a protrusion on or forming part of the cap layer. This is quite different from forming an opening or through-hole in the enclosure, as was done in some prior art embodiments.

In an embodiment, step (b) comprises removing part of the cap layer.

It is an advantage that the protrusion can be made as part of the cap layer itself.

It is an advantage that the removal of the material of the cap layer can be performed by standard semiconductor processes, such as lithographical and etching techniques, which techniques can be extremely accurate.

It is a further advantage that the window is integrally formed with the cap layer, such that the step of connecting a separate window is avoided. In addition, a contact surface between different materials (e.g. between a deposited material and the cap layer) can be avoided, hence also reflections can be avoided.

In a particular embodiment, removing in step b) comprises etching.

Etching is a commonly used technique in the semiconductor industry, thus no special equipment is required.

In an alternative embodiment, step (b) comprises adding a transparent layer on top of the cap layer.

A preferred method of such adding is depositing of a layer, such as e.g. a Germanium layer. Deposition of the layer has the advantage that another material can be used than was used for the cap layer. It is an advantage that this additional layer may have different properties, which may e.g. be more suitable for particular environments.

Besides deposition, a transparent layer can also be added by way of any other suitable method, for instance printing.

In an embodiment, step c) comprises inserting the semiconductor structure in a molding device cavity, and introducing a molding compound into the molding device cavity for encapsulating the semiconductor structure except where the tool is in contact with the protrusion; and wherein step d) further comprises removing the semiconductor structure from the molding device cavity.

The molding compound is preferably a plastic material, for instance a thermoset plastic material. Possible techniques include transfer molding, injection molding, potting, but other encapsulation techniques for encapsulating with e.g. plastic, silicone or other material may also be used.

In an embodiment, the method further comprises the step of physically or chemically treating an outer surface of the protrusion.

An example of physical treatment is "polishing", which may e.g. be applied for cleaning the surface. Another example may be "sand-blasting", for increasing its roughness for scattering impinging light.

It is noted that this step of physical or chemical treatment may be applied to the protrusion before or after the encapsulation compound is applied.

In an embodiment, the cap layer in step b) is formed in such a way that the resulting protrusion has a first cross-section at a first distance from the substrate, and a second cross-section at a second distance from the substrate larger than the first distance, whereby the area of the first cross-section is larger than the area of the second cross-section.

In an example, the protrusion has a substantially frusto-conical shape, e.g. frusto-conical shape with a larger diameter of a cross-section in a plane closer to the substrate than at its top. Such a shape can e.g. be made by means of etching, or by means of deposition or printing in several steps. Such a shape is impossible to make with prior art methods, because removal of a tool (e.g. a pin or tube) without damaging the package necessitates that the tool is cylindrical or tapering to its distal end. A frusto-conical shape may be a highly desirable shape when it comes to optical devices, because it can create sharper images.

In a second aspect, the present invention provides a packaged optical semiconductor device having a transparent window, comprising: a substrate comprising an opto-electric element located in a cavity formed between the substrate and a transparent cap layer having a substantially flat, e.g. flat upper surface; the cap layer being made of a material transparent to light, and having at least one protrusion extending on top of the substantially flat, e.g. flat upper surface, the protrusion being integrally formed with the cap layer; an encapsulating layer made of an opaque material applied to at least the cap layer and to a side surface of the at least one protrusion, a top surface of the protrusion being substantially flush, e.g. flush with an outer surface of the encapsulating layer.

It is an advantage that the top of the protrusion is substantially flush, e.g. flush with the surrounding area (encapsulated cap layer), which allows easy access to the window, because the window is not located at the bottom of an aperture. This enables easy post-treatment, such as e.g. polishing or sand-blasting. In addition, there is no blind hole which can accumulate dust or dirt or moisture, hence the risk of the window being obstructed by dust or dirt during actual use of the device is reduced, or even eliminated.

In an embodiment, the opaque material is a molding compound.

Preferably thermoset plastic materials are used to encapsulate electronic devices, but thermoplastic polymer material or silicone materials could also be used.

In an embodiment, the at least one protrusion has a first cross-section at a first distance from the substrate, and a second cross-section at a second distance from the substrate larger than the first distance, whereby the area of the first cross-section is larger than the area of the second cross-section.

An example of such a protrusion forming a window through the package, is a protrusion with a frusto-conical shape.

In an embodiment, the device is an IR-sensor or an IR transmitter.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 1(a) shows a semiconductor structure and a mold having a protrusion with a shape corresponding to the aperture to be created. FIG. 1(b) shows the mold in contact with said semiconductor structure, while a mold compound is applied. FIG. 1(c) shows the encapsulated semiconductor structure after the mold is removed.

FIG. 2(a) shows the semiconductor structure of FIG. 1(a), known in the art. FIG. 2(b) shows the semiconductor structure of FIG. 2(a) after making a protrusion, and a mold having a flat surface region. FIG. 2(c) shows the mold in contact with the protrusion, while a molding compound is applied. FIG. 2(d) shows the packaged semiconductor structure after the mold is removed.

Figure 1A:
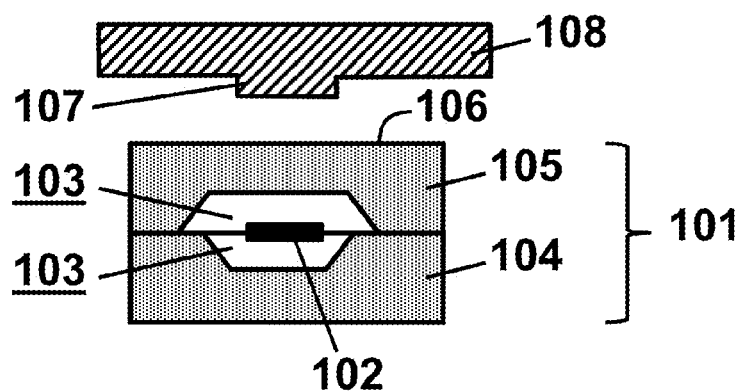
FIG. 1(a) to FIG. 1(c) show a method (and mold) that can be used for encapsulating a semiconductor structure while leaving an aperture.

In the different drawings, the same reference signs refer to the same or analogous elements. Any reference signs in the claims, referring to the drawings, shall not be construed as limiting the scope.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

With "radiation" in the context of the present invention is meant electromagnetic radiation of any type which can be detected by a detector element, e.g. light, X-rays, gamma rays. Alternatively, the impinging radiation may be particles, including low or high energy electrons, protons, hadrons or other particles.

With "light" in the present invention is meant electromagnetic radiation with a wavelength between 375 and 1000 nm, e.g. visible light, IR (Infra Red) radiation, near IR or UV (Ultra Violet) radiation, or combinations thereof.

Where in the present invention a material layer is said to be "transparent" to radiation, e.g. light, what is meant is that the attenuation of radiation passing through said material layer is less than a first predefined value, e.g. less than 10 dB, for the predefined frequency range (e.g. the frequency range of IR light).

Where in the present invention a material layer is said to be "non-transparent" or "opaque" to radiation, e.g. light, what is meant is that the attenuation of the radiation passing through said material layer is more than a second predefined value, e.g. more than 40 dB for a predefined frequency range (e.g. the frequency range of IR light). If a material is opaque to radiation, it can either reflect that radiation, or it can absorb that radiation.

Figure 1B:
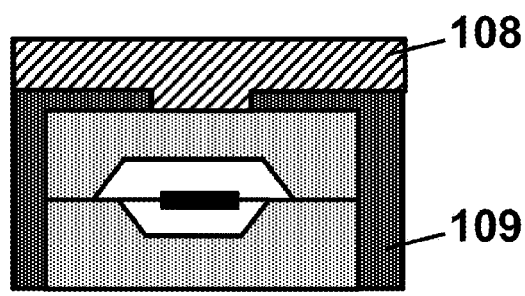
Figure 1C:
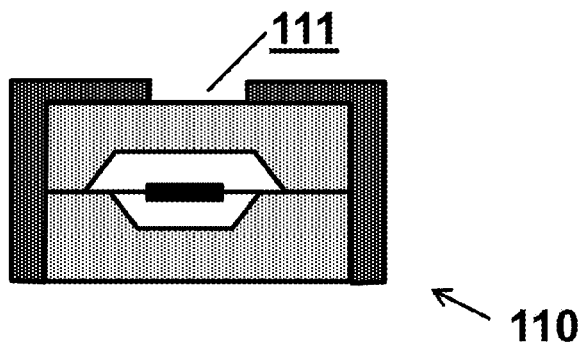

FIG. 1(a) to FIG. 1(c) illustrate a method of encapsulating a semiconductor structure 101. The structure 101 to be encapsulated comprises a substrate 104 having semiconductor elements, e.g. a opto-electrical element 102 located in a cavity 103 formed between the substrate 104 and a cap layer 105, which cap layer is connected to the substrate 104 in a known manner. The cap layer 105 has a substantially flat, e.g. flat upper surface 106. Also shown in FIG. 1(a) is a part of a molding device, e.g. having a molding tool 108 with a protrusion 107. The protrusion 107 of the molding tool 108 has a three-dimensional shape corresponding to an aperture 111 to be formed in an upper part of the encapsulated device 110 to be made. Thereto the semiconductor structure 101 is inserted in a molding device (not shown) and the flat surface region 106 of the cap layer 105 is brought into contact with the protrusion 107 of the molding tool 108. A opaque molding compound 109 is then injected in the molding device, for encapsulating the substrate 104 and the cap layer 105 at those locations that are not in contact with the protrusion 107 of the molding tool 108. In particular this means that a molding compound of a sufficient thickness, and made of a material that is e.g. reflecting or absorbing for the kind of radiation to be measured, e.g. IR radiation, is injected into the molding device. The required layer thickness (d2−d1) (see FIG. 5) depends on the material properties of the molding compound. The layer thickness (d2−d1) should e.g. be chosen at least 10 micron thickness for commonly known and used plastic molding compounds. The molding compound forms a package of the semiconductor structure with a cavity 111. Hence, the shape of the protrusion 107 of the molding tool 108 defines the shape of the aperture 111 of the final device 110. After cooling and removing the mold 108, an encapsulated semiconductor device 110 as shown in FIG. 1(c) is obtained. This device has an aperture 111 for allowing radiation, e.g. light, to enter or exit the cavity 111 through the transparent cap layer 6, depending on what kind of opto-electric component or element is present in the cavity 103, e.g. an IR-sensor, or a Light Emitting Diode, etc. Of course, the drawings of FIG. 1 are over-simplified, and in practice the substrate 104 can comprise many other integrated components or sub-circuits, such as amplifiers, voltage regulators, processors, etc., and the cap layer 105 may cover only a small part of the substrate 104, and the semiconductor structure may be connected to a lead frame, but these aspects are well known in the art, and need not be discussed here in detail. A problem of this method is that the mold tool 108 needs to be modified for each new semiconductor device, which is cost intensive.

Looking for a method which does not require the molding tool 108 to be modified for each different design, the inventors surprisingly came up with the idea illustrated in FIG. 2. Instead of providing a tool 108 with a protrusion 107 for making an aperture 111, as was done in the method shown in FIG. 1, a protrusion 7 is made on or in the cap layer 5. This protrusion 7 can be made in several ways, but the preferred way is to etch away part of the upper surface 6 of the cap layer 5 using lithography, thereby providing a semiconductor structure 1 as illustrated in FIG. 2(b). In this case, the etching step thus defines the dimensions of the protrusion 7, and thus the amount of FOV (Field Of View) of the window 11. Other ways for making the protrusion are also envisioned, such as e.g. adding the protrusion 7 by way of deposition of a transparent material, or by printing of a material layer that is transparent for the incoming radiation. An advantage of etching is that the process is simple and well known.

This semiconductor structure 1 with protrusion 7 is then inserted in a molding cavity (not shown) and the molding tool 8 with a substantially flat, e.g. flat surface region 18 is brought into contact with the protrusion 7 for preventing molding compound to be applied on the top of the protrusion 7. A molding compound 9 is injected in the molding device as schematically illustrated in FIG. 2(c). As mentioned above, the layer thickness and kind of material of the molding compound are chosen such that the layer is substantially opaque, e.g. opaque for the radiation to be measured. After hardening, and removal from the molding device, an encapsulated semiconductor device 10 as shown in FIG. 2(d) is obtained. As can be seen, the protrusion 7 of the cap layer 5 defines a window 11 in the package where radiation, e.g. light, can enter the cavity 3 from the outside, or can exit the cavity 3 from the inside towards the outside. The main advantage of this method is that the mold tool 8 does not need to be modified for each new semiconductor structure 1 to be packaged, but can be reused over multiple designs, thereby saving considerable tool costs. Another advantage is that the protrusion 7 is now made to the cap layer 5, which can be made by standard semiconductor processes, such as lithographical and etching techniques, which techniques can be extremely accurate, and optionally allows for more complicated shapes than are possible by existing methods. Another advantage is that the mold tool 8 with a substantially flat, e.g. flat surface area 18 can be cleaned much easier than a mold 108 having protrusions 107. Another advantage is that the top of the protrusion 7 is substantially flush, e.g. flush with the surrounding area (encapsulated cap layer), which allows easy access to the window surface, because the window is not located anymore at the bottom of an aperture (as was the case in FIG. 1(c)). This enables post-treatment, such as e.g. polishing or sandblasting. In addition, there is no blind hole anymore which can accumulate dust or dirt or moisture, hence the risk of the window being obstructed by dust or dirt is reduced.

Suitable materials for the cap layer 5 include—but are not limited to—quartz glass, sapphire glass, silicon. A suitable material for being deposited on the cap layer 5 for forming the protrusion 7 is e.g. a deposited Germanium layer. The substrate 4 may e.g. be made of sapphire, Si, GaAs, InP, GaP or the like.

The vertical height of the protrusion 7 could be in the range of 10 μm to 300 μm (but the present invention is not limited to this range). The lateral dimensions of the protrusion 7 could be in the range of 100 μm to 1000 μm (but the present invention is not limited to this range).

Figure 2A:
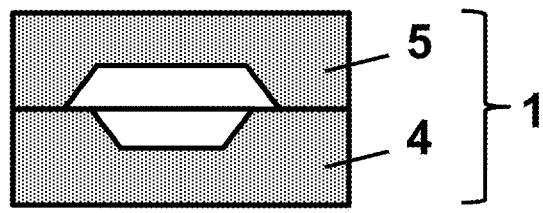
FIG. 2(a) to FIG. 2(d) schematically illustrate steps of an example of a method for manufacturing a packaged semiconductor device, according to an embodiment of the present invention.
Figure 2B:
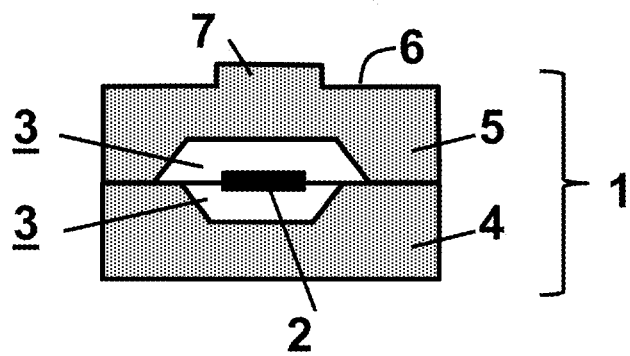
Figure 2C:
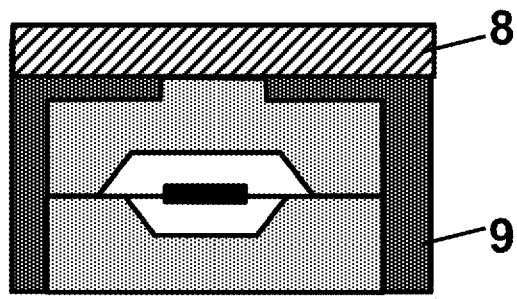
Figure 2D:
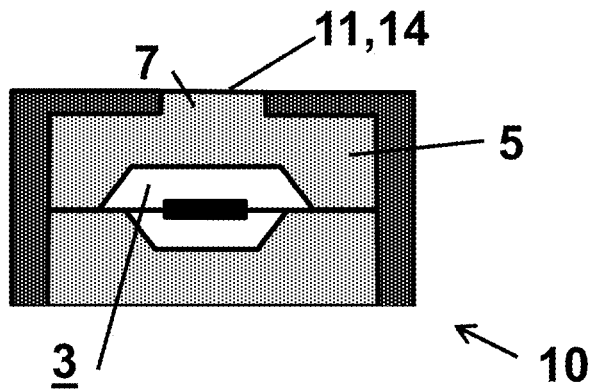
Figure 3:
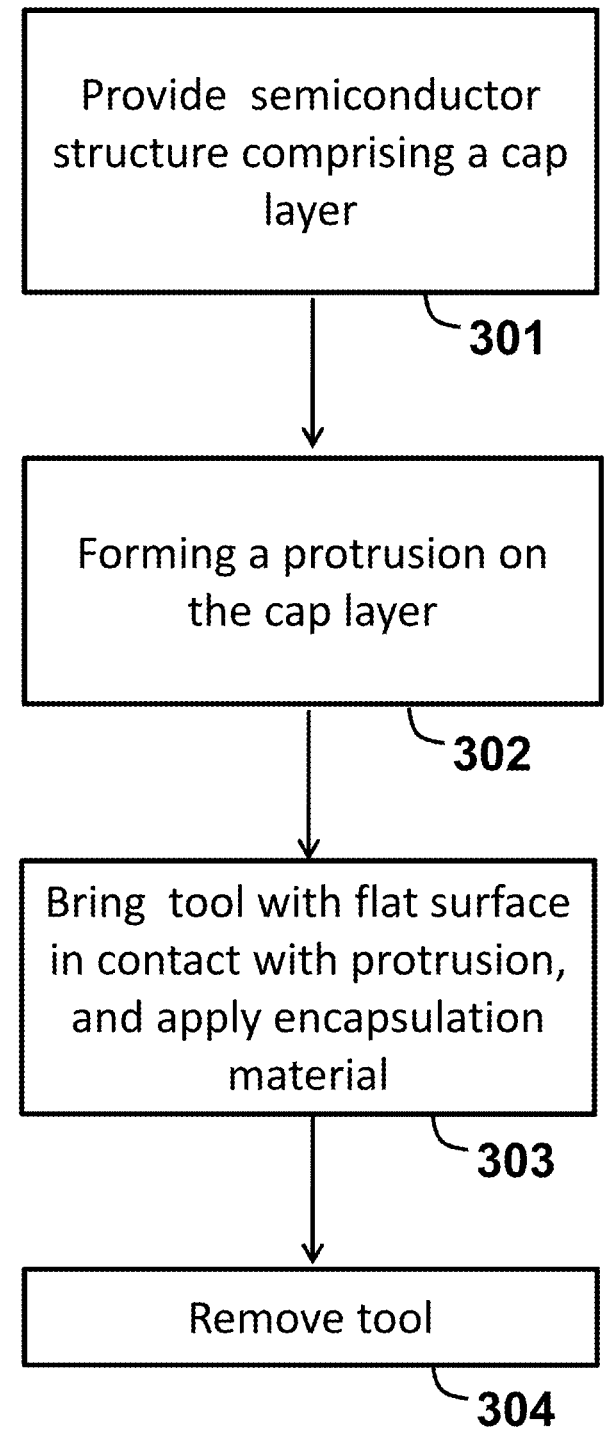
FIG. 3 shows steps of a method of manufacturing a packaged semiconductor device with a transparent window, according to embodiments of the present invention.

FIG. 3 is a flow-diagram showing the steps of a method according to embodiments of the present invention illustrated in FIG. 2(a) to FIG. 2(d).

In step 301 a semiconductor structure 1 is provided, comprising a cap layer 5, for example as shown in FIG. 2(a). Semiconductor structures 1 comprising a substrate 4 and a cap layer 5 are typically used for optical semiconductor devices, i.e. comprising integrated circuits with at least one opto-electric component, e.g. an IR sensor. Such structure 1 can be made by any suitable semiconductor technique known in the art.

In step 302 a protrusion 7 is formed on the cap layer 5. This may be performed by removing material from the cap layer 5, e.g. by way of etching, but other ways to perform the protrusion are also possible, such as e.g. embossing or printing. The shape of the protrusion 7 defines the shape of the window 11 to be formed. The result of step 302 is shown in FIG. 2(b).

In step 303 a mold tool 8 having a flat surface region is brought into contact with the protrusion 7 for preventing molding material to be deposited on top of the protrusion 7. This way, the protrusion 7 will form a transparent channel, also referred to as "window" 11 through the encapsulation or package. Then encapsulation material, e.g. plastic molding material is applied to the semiconductor structure 1. The preferred way of doing so, is to insert the semiconductor structure 1 in a molding device, and to inject a molding compound 9 into the molding device, so as to cover at least the top of the cap layer 5 and the side surface of the protrusion 7, and optionally also the side or bottom surfaces or both of the semiconductor structure 1, as illustrated in FIG. 2(c). The molding compound preferably is opaque for light, so that light can only enter or exit to the area underneath the cap layer 5 via the "window" 11 formed by the protrusion 7.

In step 304 the mold tool 8 is removed, and if the semiconductor structure 1 was inserted in a molding device, the encapsulated semiconductor structure is now removed from the molding device, resulting in the packaged semiconductor device 10 shown in FIG. 2(d), having a window 11 transparent for radiation, e.g. light. In the present invention, it is assumed that the device comprises at least one electro-optical component or element underneath the cap layer 5, hence the device 10 of FIG. 2(d) is a packaged optical semiconductor with a transparent window 11, transparent being defined in terms of intended use, selected in function of the wavelength of the radiation the packaged optical semiconductor will be used with.

Figure 4:
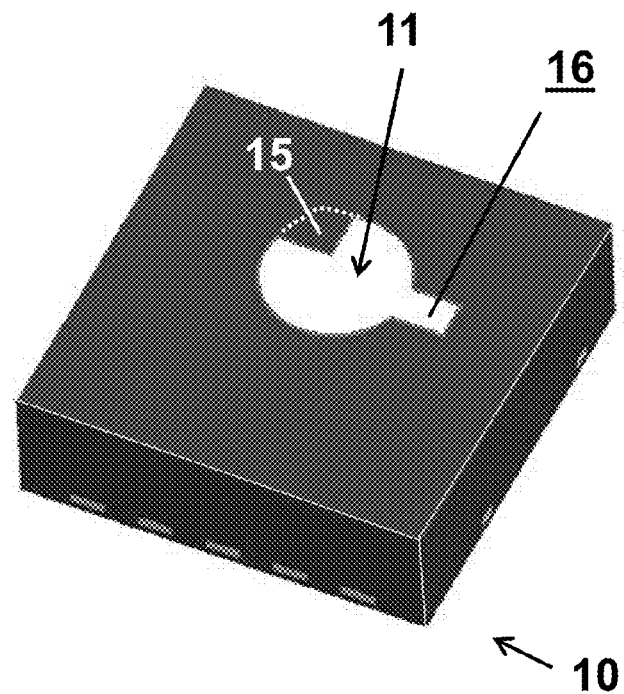
FIG. 4 shows a first example of a packaged semiconductor device according to an aspect of the present invention, having one window with a particular field-of-view.

FIG. 4 shows a three-dimensional top view of an example of a semiconductor device 10 according to embodiments of the present invention, having a window 11 with a specific field-of-view (FOV) which is substantially circular, e.g. circular, but has both an exclusion 15 (here: about 1 quadrant, the present invention, however, not being limited thereto), and an extension 16 (here: a small rectangle, the present invention, however, not being limited thereto). Windows 11 having other field-of-views can also be defined.

Figure 5:
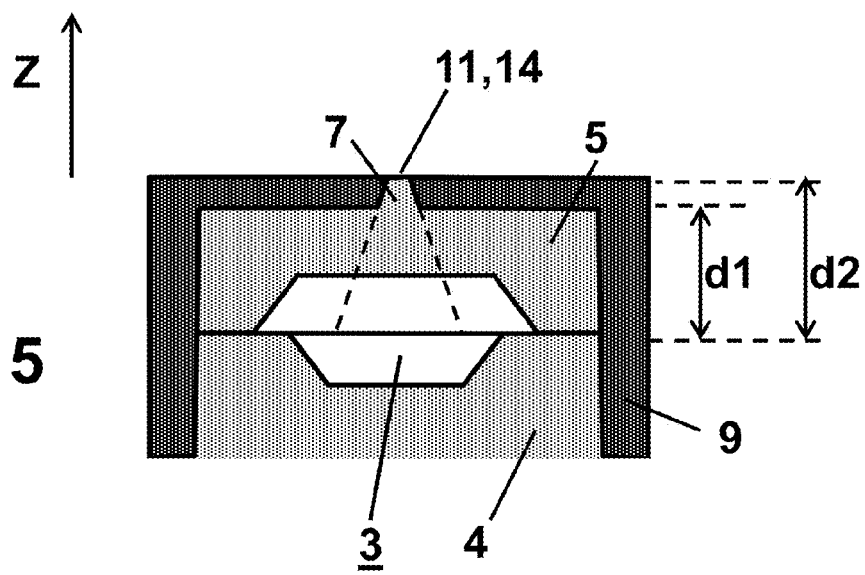
FIG. 5 shows a second example of a semiconductor device according to an embodiment of the present invention, in cross-section, having a conical window tapering at the top.

Whereas the protrusion 7 shown in FIG. 2 is substantially cylindrical, e.g. cylindrical (i.e. have a substantially constant, e.g. constant cross-section in the height direction Z), FIG. 5 shows an example of a protrusion 7 having a three-dimensional shape which cannot be made by the method illustrated in FIG. 1, but can be made by a method according to embodiments of the present invention. FIG. 5 shows a protrusion having a frusto-conical shape tapering to the top (in a direction away from the substrate 4), meaning that a first circular cross-section of the protrusion 7 taken at a first distance d1 near the "bottom" of the protrusion 7 has a larger diameter than a second circular cross-section of the protrusion 7 taken at a second distance d2 "near the top". This could be manufactured e.g. by KOH etching, but the present invention is not limited to this method. A frusto-conical shape may be particularly interesting for obtaining sharp images, as is well known in the art. But the present invention is not limited to cylindrical shapes or frusto-conical shapes, and other three-dimensions shapes can also be used.

Figure 6:
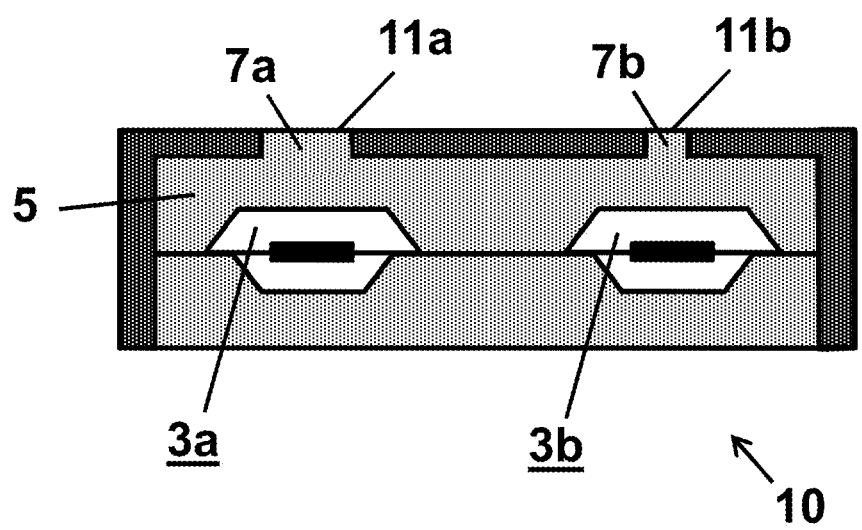
FIG. 6 shows a third example of a semiconductor device according to an embodiment of the present invention, in cross-section. The device comprises a pixel array with two pixels and two windows having a different geometry.

FIG. 6 shows a third example of a semiconductor device 10 according to an embodiment of the present invention, in 2D cross-section. This device has a pixel array of two pixels, but of course the invention is not limited thereto, and the array could also have more than two pixels. In the embodiment of FIG. 6 each pixel has a window 11, but that is not absolutely required, and in other embodiments, some pixels may have no window. The windows 11a, 11b of the different pixels may have the same feature size, or may have different feature sizes, and they may comprise the same material (e.g. when made by etching), or different material (e.g. when made by printing). In the specific example shown in FIG. 6, the windows 11a, 11b have a circular cross section (in a plane parallel to the substrate), and the diameter of the window 7a (on the left of the drawing) is larger than the diameter of the window 7b (on the right of the drawing).

In another embodiment (not shown), the semiconductor device has a plurality of windows 11, all having the same geometry.

The invention claimed is:

1. A method of manufacturing a packaged semiconductor device with a transparent window, comprising the steps of:
   a) providing a semiconductor structure comprising an opto-electric element located in a cavity formed between a substrate and a cap layer, the cap layer being made of quartz glass, sapphire glass or silicon, and having a substantially flat upper surface;
   b) forming at least one protrusion extending on top of the cap layer;
   c) bringing the at least one protrusion on top of the cap layer in contact with a tool having a substantially flat surface region, and applying an opaque material to the semiconductor structure at a portion thereof which is not in contact with the tool;
   d) removing the tool thereby providing a packaged optical semiconductor device having a transparent window.

2. A method according to claim 1, wherein step b) comprises removing part of the cap layer.

3. A method according to claim 2, wherein removing in step b) comprises etching.

4. A method according to claim 1, wherein step b) comprises adding a transparent layer on top of the cap layer.

5. A method according to claim 1,
   wherein step c) comprises inserting the semiconductor structure in a molding device cavity, and introducing a molding compound into the molding device cavity for encapsulating the semiconductor structure except where the tool is in contact with the protrusion;
   and wherein step d) further comprises removing the semiconductor structure from the molding device cavity.

6. A method according to claim 1, further comprising the step of physically or chemically treating an outer surface of the protrusion.

7. A method according to claim 1, wherein the cap layer in step b) is formed in such a way that the resulting protrusion has a first cross-section at a first distance from the substrate, and a second cross-section at a second distance from the substrate larger than the first distance, whereby the area of the first cross-section is larger than the area of the second cross-section.

* * * * *